(12) United States Patent
Abe et al.

(10) Patent No.: US 6,617,260 B2
(45) Date of Patent: Sep. 9, 2003

(54) METHOD OF MANUFACTURING SEMICONDUCTOR DEVICE PREVENTED FROM PEELING OF WIRINGS FROM INSULATING FILM

(75) Inventors: Takayuki Abe, Tokyo (JP); Yasuhide Den, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/968,020

(22) Filed: Oct. 2, 2001

(65) Prior Publication Data

US 2002/0042209 A1 Apr. 11, 2002

(30) Foreign Application Priority Data

Oct. 6, 2000 (JP) ......................................... 2000-308250

(51) Int. Cl.[7] .......................... H01L 21/31; H01L 21/469
(52) U.S. Cl. ...................... 438/777; 438/585; 438/660; 438/782
(58) Field of Search ................................ 438/777, 585, 438/782, 787, 660, 783, 784

(56) References Cited

U.S. PATENT DOCUMENTS 6,107,182 A * 8/2000 Asahina et al. ............. 438/618

FOREIGN PATENT DOCUMENTS

| JP | 3-270130 | 12/1991 |
| JP | 7-235503 | 9/1995 |
| JP | 9-8129 | 1/1997 |
| JP | 9-289247 | 11/1997 |
| JP | 11-54613 | 2/1999 |
| JP | 2000-58482 | 2/2000 |
| JP | 2000-77625 | 3/2000 |
| JP | 2000-150653 | 5/2000 |

* cited by examiner

Primary Examiner—Caridad Everhart
(74) Attorney, Agent, or Firm—Young & Thompson

(57) ABSTRACT

The present invention provides a manufacturing method of a semiconductor device which does not give rise to peeling of a metal film caused by oxygen held in a interlayer insulating film even when the wafer is subjected to a heat treatment after the metal film is formed on the interlayer insulating film. After the formation of the interlayer insulating film, oxygen held in the interlayer insulating film is removed from the interlayer insulating film, then a metal film on the interlayer insulating film.

15 Claims, 12 Drawing Sheets

| No. | SAMPLE STRUCTURE | NITRIDE FILM | WAFER CENTER | WAFER EDGE |
|---|---|---|---|---|
| 1 | SAMPLE (1) -1 | 50nm | OK | OK |
| 2 | SAMPLE (1) -2 | 100nm | NG | NG |
| 3 | SAMPLE (1) -3 | 150nm | NG | NG |
| 4 | SAMPLE (1) -4 | 200nm | NG | NG |
| 5 | SAMPLE (2) | 100nm | OK | OK |

| No. | ANNEALING CONDITION | WAFER CENTER | WAFER EDGE |
|---|---|---|---|
| 1 | 700°C、1min | OK | OK |
| 2 | 700°C、30min | OK | OK |
| 3 | 750°C、10min | OK | OK |
| 4 | 750°C、30min | OK | OK |

METHOD OF MANUFACTURING SEMICONDUCTOR DEVICE PREVENTED FROM PEELING OF WIRINGS FROM INSULATING FILM

BACKGROUND OF THE INVENTION

1. Field of the Invention

The present invention relates to a manufacturing method of a semiconductor device and, more particularly to a manufacturing method of a semiconductor device in which a wiring layer composed of a metal film is formed on an interlayer insulating film.

2. Description of the Related Art

Large scale integrated circuits (LSIs) known as the representative of the semiconductor devices can roughly be classified into memory products and logic products. Together with the progress of manufacturing technologies of semiconductor devices in recent years, the development, especially in the former, is remarkable. The semiconductor memories are classified into dynamic random access memories (DRAMS) and static random access memories (SRAMS). Since it is possible in the DRAM to take more extensive advantage of high degree of integration than in the SRAM and hence realize more cost reduction than in the SRAM, it is being applied widely to various kinds of memory devices in information equipment or the like.

In a DRAM, one memory cell is constituted by a memory cell transistor composed of a metal oxide semiconductor (MOS) transistor performing switching operation, and a capacitor connected to one diffusion region of the memory cell transistor, and information is stored by the memory cell as electrical charges into the capacitor. Here, in the DRAM, information to be written is transformed to the capacitor via the memory cell transistor from a bit line connected to the other diffusion region of the memory cell transistor, and information stored in the capacitor is read out there from via the transistor to the bit line. The bit line which serves as the path for writing and reading information is thus required to be in resistance as small as possible, for the purpose of increasing the operation speed. In recent years, therefore, a tungsten (W) film which has been used preferentially. The W film is formed as a bit line as a bit line on an interlayer insulating film and connected to the cell transistor through a contact hole provided in the interlayer insulating film.

It has been, however, observed that the W film often peels off from the interlayer insulating film occurs.

In order to remove such drawback, the Japanese Laid Open, (Kokai) Patent Publication Hei 9-289247 proposed an improved method of producing a DRAM. The description will be now made on such method with reference to FIGS. 10A to 10D.

As shown in FIG. 10A, after formation of wiring layers 52 each consisting of a polycide and an aluminum alloy containing a slight amount of metal such as copper on an insulating film 51, a silicon oxide film 53 as an interlayer insulating film is formed on the wirings 52 by a high density plasma chemical vapor deposition (HDP-CVD) method. Next, as shown in FIG. 10B, the silicon oxide film 53 is flattened by chemical mechanical polishing method.

Next, as shown in FIG. 10C, contact holes 54 are formed in the silicon oxide film 53 by photolithography.

In the conventional method, wiring material was deposited just after the formation of the contact holes. However, when a W film as the wiring material was deposited, the W film peeled off from the interlayer insulating film during the deposition of the W film. This is because gases such as hydrogen and argon confined in the silicon oxide film 53 as the interlayer insulating film were degassed and pushed up the W film during the deposition of the W film at a temperature of about 400° C.

Therefore, just after the formation of the contact holes 54 in FIG. 10C, gases such as hydrogen and argon held in the silicon oxide film 53 are degassed by subjecting the wafer to an annealing in a nitrogen atmosphere at a temperature in the range of 350 to 450° C. (degrees Centigrade) for 60 min.

Next, as shown in FIG. 10D, after forming an adhesion layer 55 consisting of Ti/TiN by sputtering or the like, a W film 56 is formed by a chemical vapor deposition (CVD).

According to this method, by subjecting the wafer to an annealing at a temperature in the range of 350 to 450° C. prior to the formation of the W film, it is possible to remove (degas) gases such as hydrogen and argon confined in the silicon oxide film 53 during formation of the silicon oxide film 53 by the HDP-CVD, so that there take place no such degassing at formation of the W film 56. Accordingly, this prior art claims that there will not occur peeling of the W film 56 due to push of gases at the degassing.

Although it is not described in the above prior art, the W film needs to be patterned to wirings after the process of FIG. 10D. When a metal film such as aluminum is used as wirings, the metal film can be patterned employing a resist film as a mask. However it is not appropriate that a resist film is employed as a mask for patterning the W film because it is not possible to obtain a sufficient selectivity between the resist film and the W film. Therefore, a silicon nitride film is used as a mask for patterning the W film.

It was found by the present inventor that when the silicon nitride film as the mask for patterning the W film is formed after formation of the W film according to the method in the above prior art, the W film actually peels off from the interlayer insulating film. Since it is difficult that the silicon nitride film is formed in low temperature when a thermal reaction is employed, the silicon nitride film is usually formed in temperature range of 700 to 750° C. When the wafer is subjected to a heat treatment at such high temperature after formation of the W film, gases including oxygen which have been confined in the interlayer insulating film are degassed to the outside, and the adhesion of the W film to the interlayer insulating film is aggravated due to oxidation of the W film by the gases including oxygen. Moreover, it was found that gases including oxygen held in the interlayer insulating film is scarcely desorbed at a temperature in the range of 350 to 450° C., and these gases are desorbed in a large quantity at higher temperatures than in the quoted range. In the above prior art, the heat treatment in the quoted temperature range is performed for the sole purpose of preventing peeling due to push-up of the W film caused by degassing of hydrogen or argon, and it utterly lacks the recognition as to the peeling problem caused by the degassing of gases including oxygen from the interlayer insulating film. As a result, according to the manufacturing method disclosed in the above prior art, gases including oxygen are held in large quantity in the layer insulting film even after an annealing at a temperature in the range of 350 to 450° C., and if the wafer is subjected to a heat treatment at a higher temperature, the W film will be oxidized by the degassing of gases including oxygen and will be peeling off from the interlayer insulating film.

SUMMARY OF THE INVENTION

The object of the present invention which was motivated by the above circumstance is to provide a manufacturing method of a semiconductor device capable of preventing the peeling of the W film caused by the gases including oxygen held in the interlayer insulating film even if the wafer is subjected to a heat treatment at higher temperatures after formation of the W film.

The method according to the present invention includes forming an insulating film over a semiconductor substrate, oxygen being introduced into the insulating film during formation of the insulating film, removing the oxygen from the insulating film to provide an oxygen-removed insulating film, and forming a metal film on the oxygen-removed insulating.

The removing the oxygen is performed by an annealing treatment.

The annealing treatment is performed at a temperature which is not lower than a heat treatment which may be carried out in a later step than formation of said metal film.

The later step includes forming a silicon nitride film over the metal film.

The insulating film is formed of a CVD silicon oxide film.

Moreover, the method according to the invention includes forming a first insulating film over a semiconductor substrate, forming a metal film on the first insulating film, and forming a second insulating film on the metal film at a first temperature, wherein annealing treatment is performed on the first insulating film before the metal film is formed, the annealing treatment being carried out at a second temperature which is not lower than the first temperature.

The second insulating is used as a mask for selectively etching the metal film to form a wiring layer.

The method further comprises selectively etching the second insulating film to form a mask pattern and selectively etching the method film by use of the mask pattern to form a wiring layer, the first insulating film being a CVD silicon oxide film and the second insulating film being a silicon nitride film.

The second insulating film is formed at a temperature in the range of 700 to 750° C., and the annealing treatment is carried out at a temperature in the range of 700 to 800° C.

The metal film can comprise at least one of a W film, a WN film, a TiN film and a Ti film.

According to such methods, gases including oxygen held in the insulating film under the metal film are removed in advance prior to the formation of the metal film, so that even if wafer is subjected to a high temperature treatment such as the formation of the silicon nitride film after formation of the metal film, there will occur no degassing of oxygen form the insulating film. As a result, it is possible to prevent peeling of the metal film from the insulating film due to oxidation of the metal film by the oxygen.

BRIEF DESCRIPTION OF THE DRAWINGS

The above and other object, advantages and features of the present invention will be more apparent from the following description taken in conjunction with the accompanying drawings, in which.

DESCRIPTION OF THE PREFERRED EMBODIMENTS

First Embodiment

In the following, referring to FIGS. 1A to 1M, the manufacturing method of the semiconductor device will be described in the order of the processes.

Figure 1A:
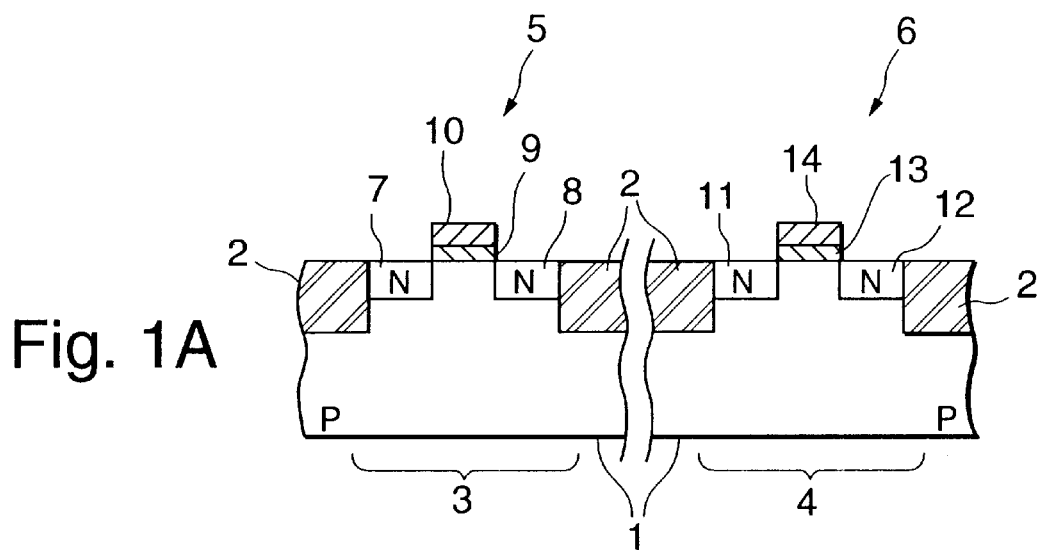
FIGS. 1A to 1M are process diagrams shown in the order of the processes of The method according to a first embodiment of the invention.

First, as shown in FIG. 1A, a plurality of active regions are isolated by forming element isolation regions (field insulating films) 2 in a P type silicon substrate 1 using the well-known LOCOS (Local Oxidation Of Silicon) method, STI (Shallow Trench Isolation) method or the like. A memory cell transistor 5 and a peripheral circuit element 6 consisting of MOS transistor are formed in the memory cell region 3 and peripheral circuit region respectively. The MOS transistor constituting the memory cell transistor 5 has a pair of N type diffusion regions 7 and 8 which become source and drain regions, and a gate electrode 10 formed via an gate insulating film 9 between both regions 7 and 8. The MOS transistor constituting the peripheral circuit element 6 has a pair of N type diffusion regions 11 and 12 which become the source and drain regions, and a gate electrode 14 formed via an insulating film 13 between both regions 11 and 12. The N type diffusion regions 7, 8, 11 and 12 are formed by in implanting desired N type impurities such as phosphorus (P), followed by an annealing treatment for activation of the impurities. The temperature of the annealing treatment is performed at about 800° C.

Figure 1B:
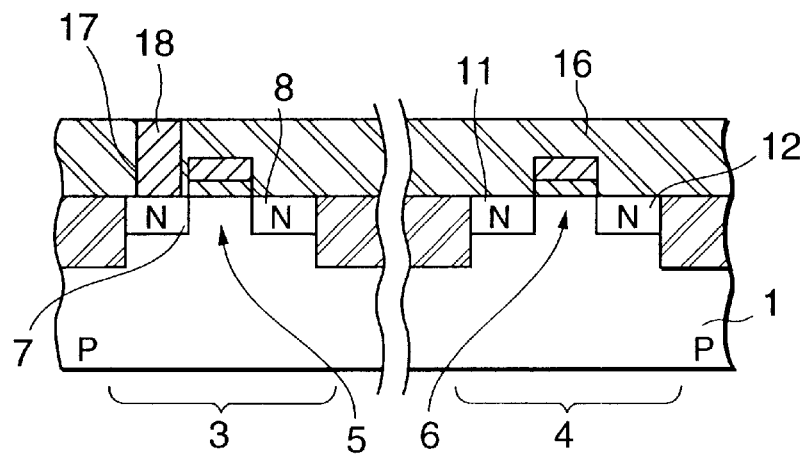

Next, as shown in FIG. 1B, after forming a first interlayer insulating film 16 with thickness of 200 to 400 nm consisting of a silicon oxide film is formed on the entire surface by CVD (Chemical Vapor Deposition), a contact hole 17 which exposes the N type diffusion region 7 to be connected to a bit line is formed in the first insulating film 16 above the memory cell region 3 by photolithography. Next, after forming a conductive film consisting of amorphous silicon doped with, for example, phosphorus on the entire surface by CVD, unwanted conductive film is removed by etchback, and a plug layer (first plug layer) 18 is filled in the contact hole 17.

Figure 1C:
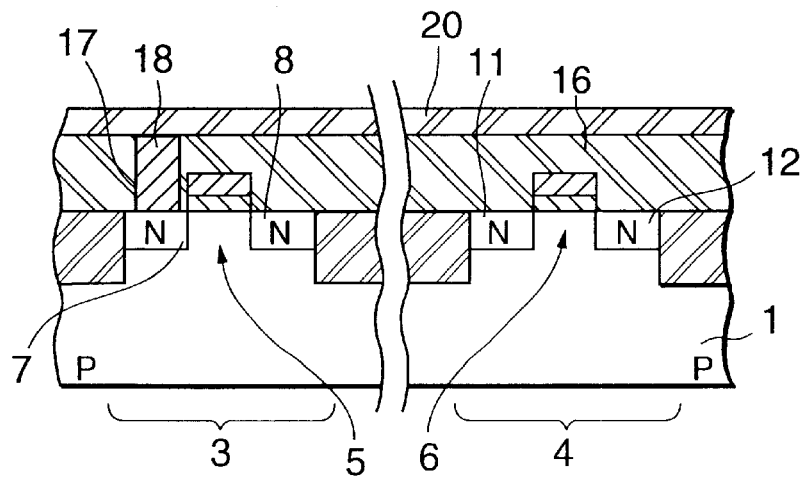

Next, as shown in FIG. 1C, a second interlayer insulating film 20 with thickness of 150 to 300 nm consisting of a P (plasma)-TEOS oxide film is formed on the entire surface by P (plasma)-CVD. Next, the substrate 1 is subjected to an annealing treatment in a nitrogen atmosphere of the temperature in the range of 700 to 800° C. for 1 to 30 min, to degas the gas including oxygen held in the first and second interlayer insulating films 16 and 20. In this embodiment, since the above annealing treatment for activation of the impurities is about 800° C., the annealing treatment of the process in FIG. 1C should be performed at less than 800° C. to restrain re-diffusion of each of the diffusion regions 7, 8, 11 and 12.

Figure 1D:
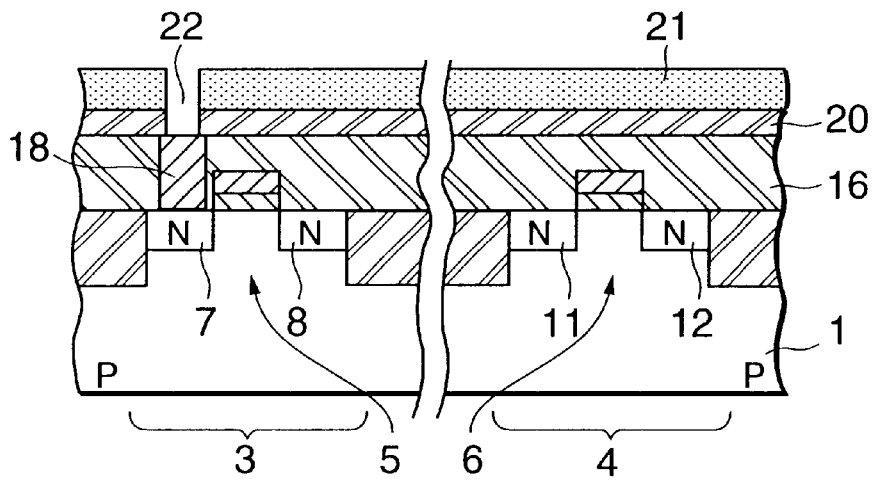
Figure 1E:
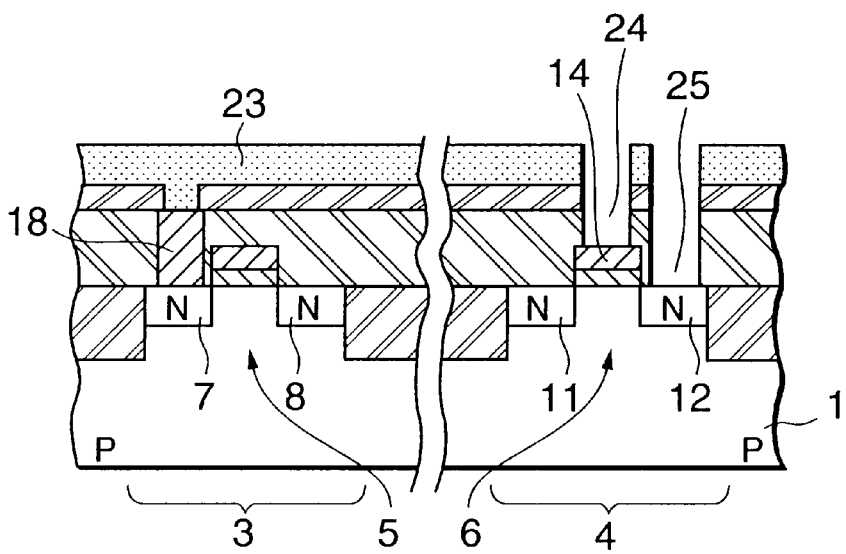

Next, as shown in FIG. 1D, after forming a resist film 21, a dry etching is applied to the second interlayer insulating film 20 with the resist film 21 as a mask to form a contact hole 22 that exposes the plug layer 18. Next, the resist film 21 is removed, and after forming a resist film 23 by newly applying the resist, as shown in FIG. 1E, a dry etching is given with the resist film 23 as a mask to form contact holes 24 and 25 that expose the gate electrode 14 and the N type diffuse region 12, respectively.

Figure 1F:
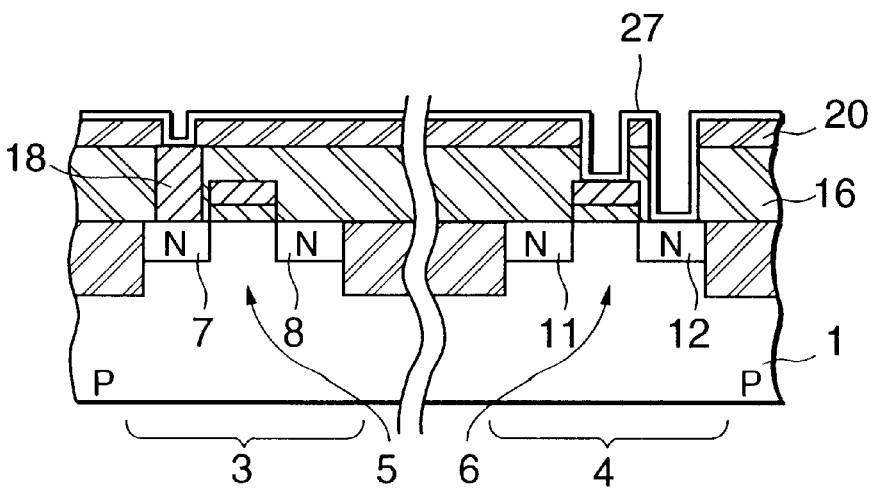

Next, as shown in FIG. 1F, an adhesion layer (first adhesion layer) 27 is formed by forming a Ti film with thickness of about 10 nm and a TiN film with thickness of about 30 nm on the entire surface by sputtering.

Figure 1G:
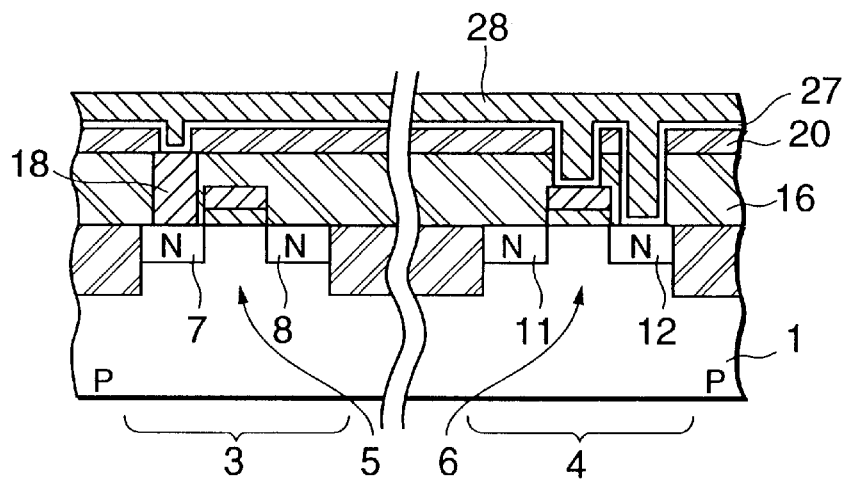
Figure 1H:
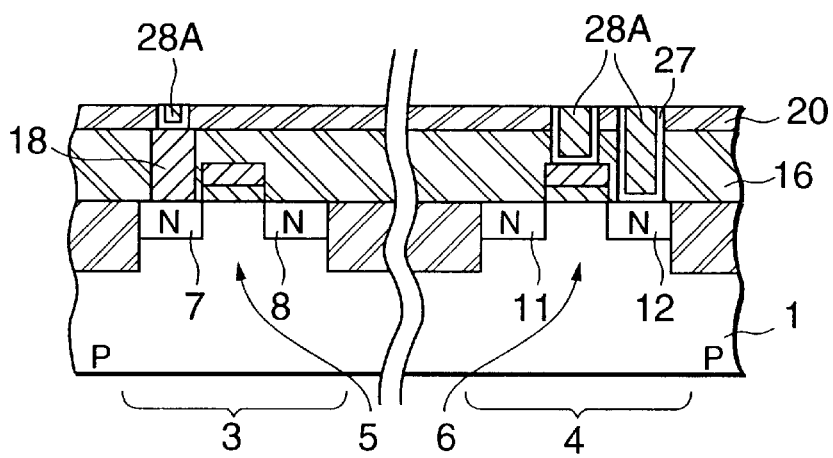

Next, as shown in FIG. 1G, a W film 28 with thickness of about 40 nm is formed on the entire surface by CVD. Next, as shown in FIG. 1H, unwanted W film 28 is removed by CMP (Chemical Mechanical Polishing), and a W plug layer (second plug layer) 28A is filled in each of the contact holes 22, 24 and 25.

Figure 1I:
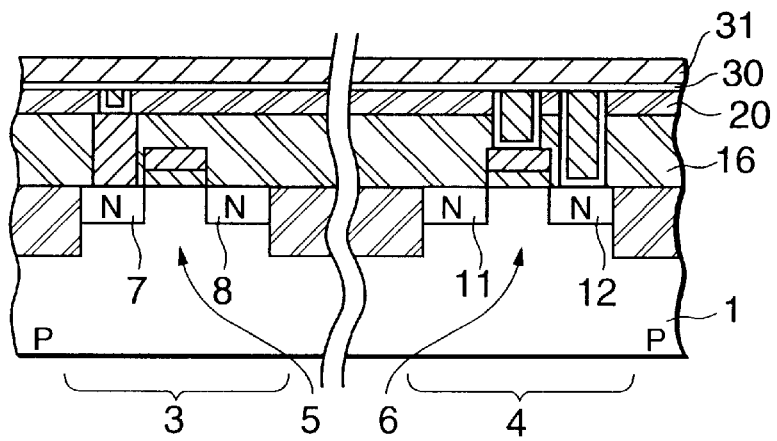

Next, as shown in FIG. 1I, a WN film 30 with thickness of about 10 nm and a W film 31 with thickness of about 40 nm are formed sequentially on the entire surface by sputtering. Here, the WN film 31 is used as an adhesion layer (second adhesion layer) for forming the W film 31 on the second interlayer insulating film 20 with high adhesion.

Figure 1J:
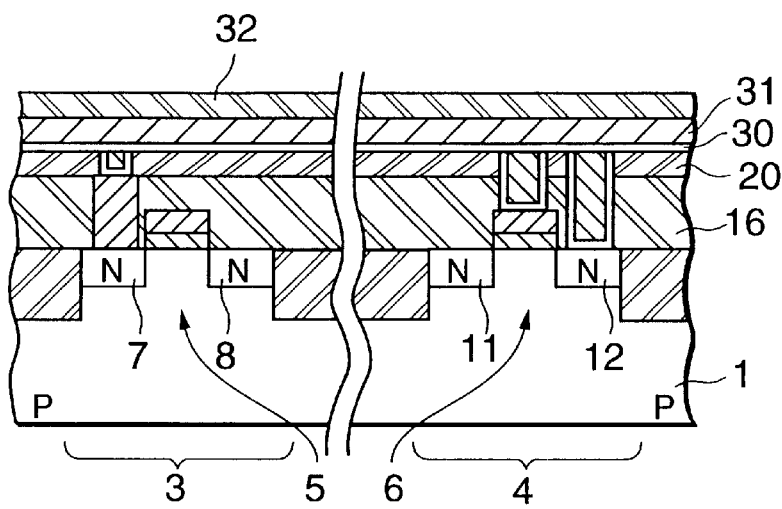

Next, as shown in FIG. 1J, a silicon nitride film (SiN) 32 with thickness of about 150 nm is formed on the entire surface by CVD while holding the substrate 1 at a temperature of about 700° C. The nitride film 32 is for using it as a mask film for patterning the W film 31. Here, for the formation of the nitride film 32, temperature is not limited to 700° C. as in the above, and it may be performed in the temperature range of 700 to 750° C.

As in the above, the nitride film 32 is formed at about 700° C. Since, however, gas including oxygen held in the interlayer insulating films 16 and 20 is already removed by the annealing in the process of FIG. 1C, there is almost no degassing of gas including oxygen from the interlayer insulating films 16 and 20 in the formation process of the nitride film 32. Accordingly, there does not occur a problem that the WN film 30 and the W film 31 are oxidized by the gas including oxygen liberated from the interlayer insulating films 16 and 20, and peel off from the interlayer insulating film 20. In particular, although a stress is applied to the W film 31 by the formation of the nitride film 32, according to the present invention, the W film 31 can be held on the second interlayer insulating film 20 via the WN film 30.

Figure 1K:
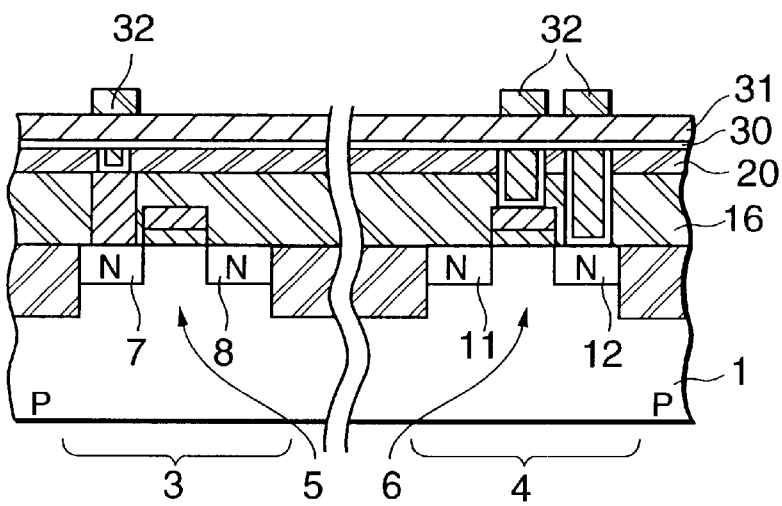
Figure 1L:
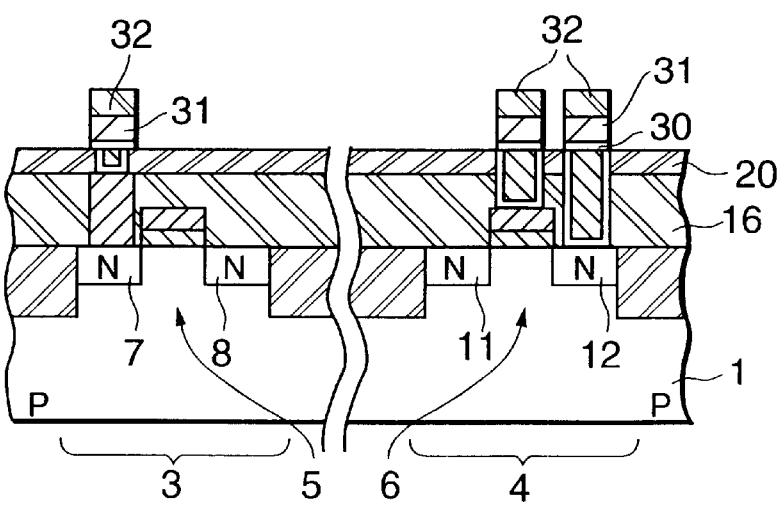

Next, as shown in FIG. 1K, the nitride film 32 is patterned in a mask film of desired form by photolithography. Next, as shown in FIG. 1L, dry etching is applied sequentially to the W film 31 and the WN film 30 to pattern them by using the patterned nitride film 32 as a mask.

Figure 1M:
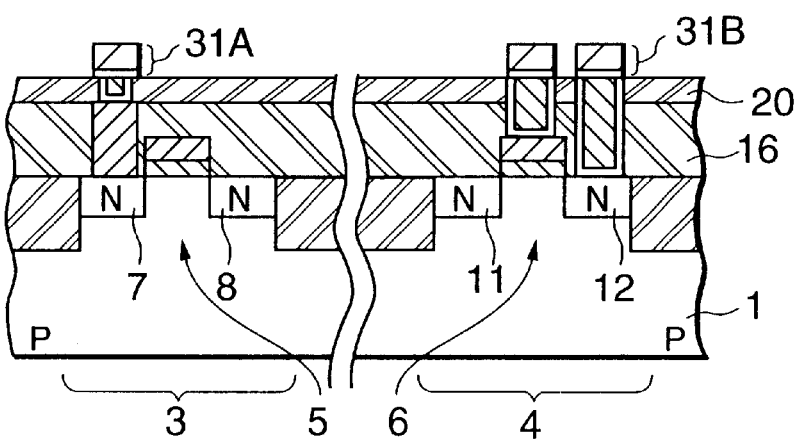

Following that, as shown in FIG. 1M, the nitride film 32 used as the mask is removed. As a result of the series of manufacturing processes, the W film 31 and the WN film 30 are patterned in desired forms, and a bit line 31A and wirings 31B are formed on the memory cell region 3 and the peripheral circuit region 4, respectively. Here, the bit line 31A and the wirings 31B are extended in the depth direction of the paper on the second interlayer insulating film 20.

Hereafter, a capacitor which is connected to the other diffusion region 8 of the memory cell transistor 5 is formed, though not shown, completing a DRAM.

Figure 2:
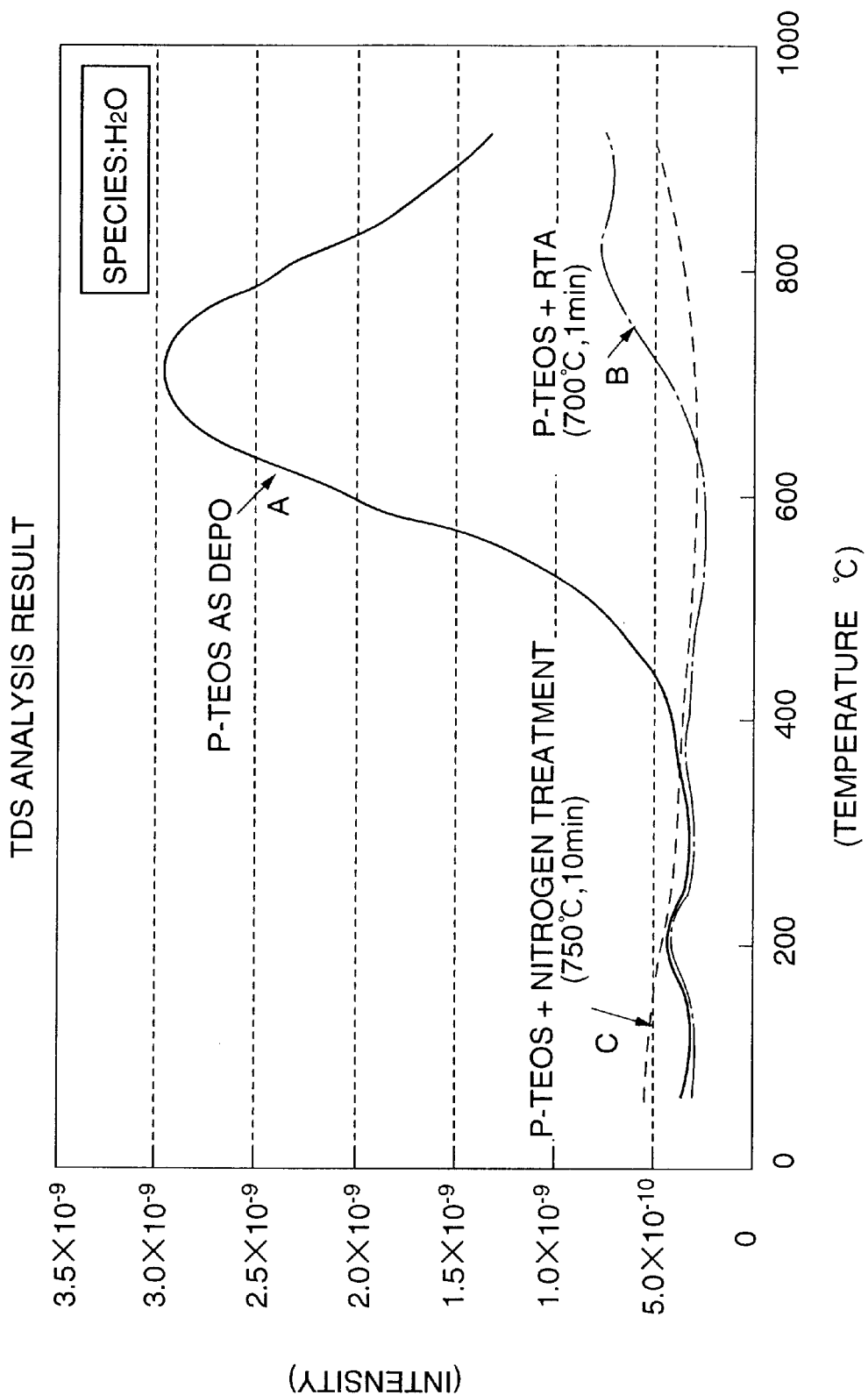
FIG. 2 is a diagram showing the result of thermal desorption spectroscopy (TDS) analysis relating to $H_2O$ in the semiconductor device manufactured by The method according to the invention.
Figure 3:
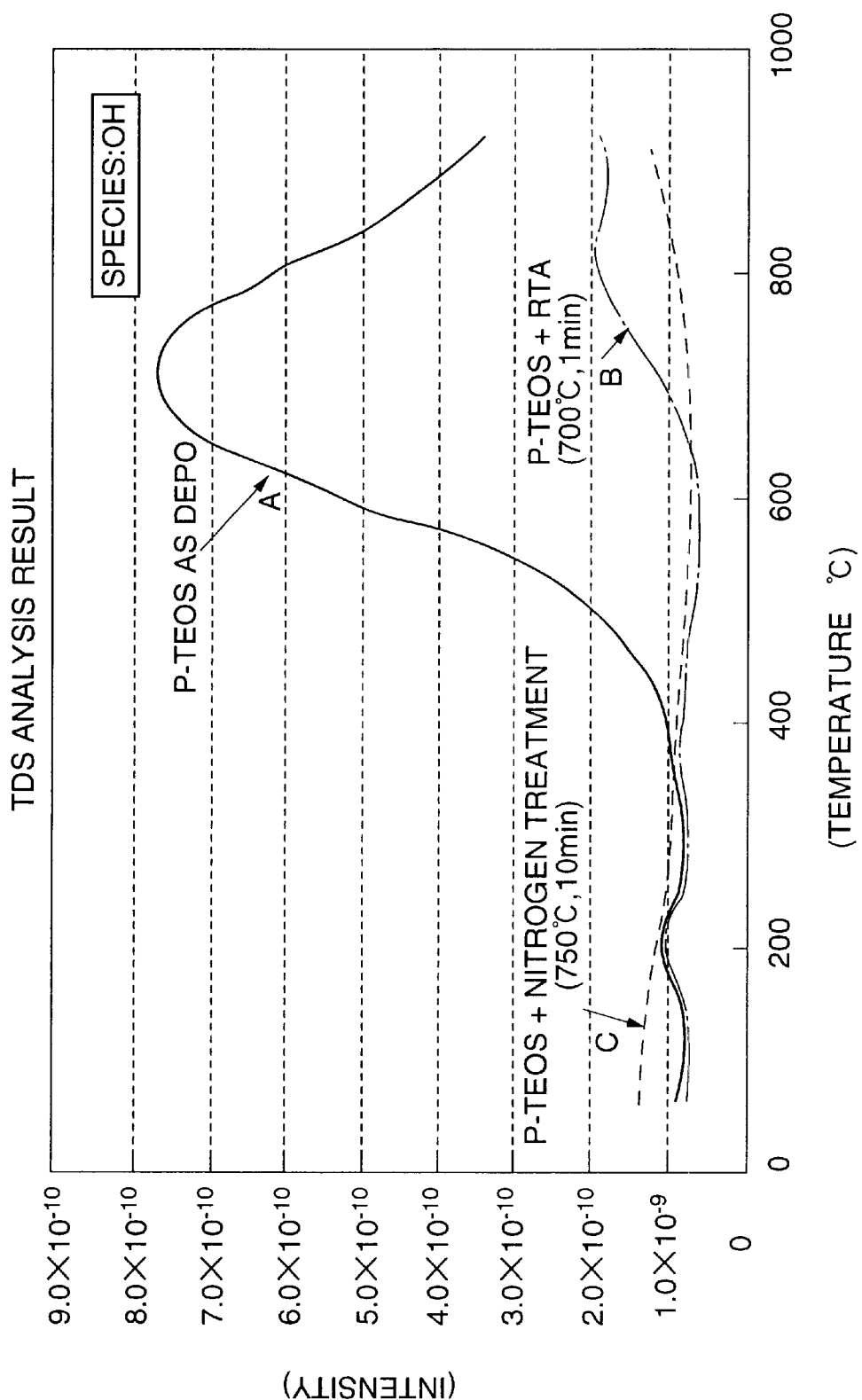
FIG. 3 is a diagram showing the result of TDS analysis relating to OH in the semiconductor device manufactured by The method according to the invention.
Figure 4:
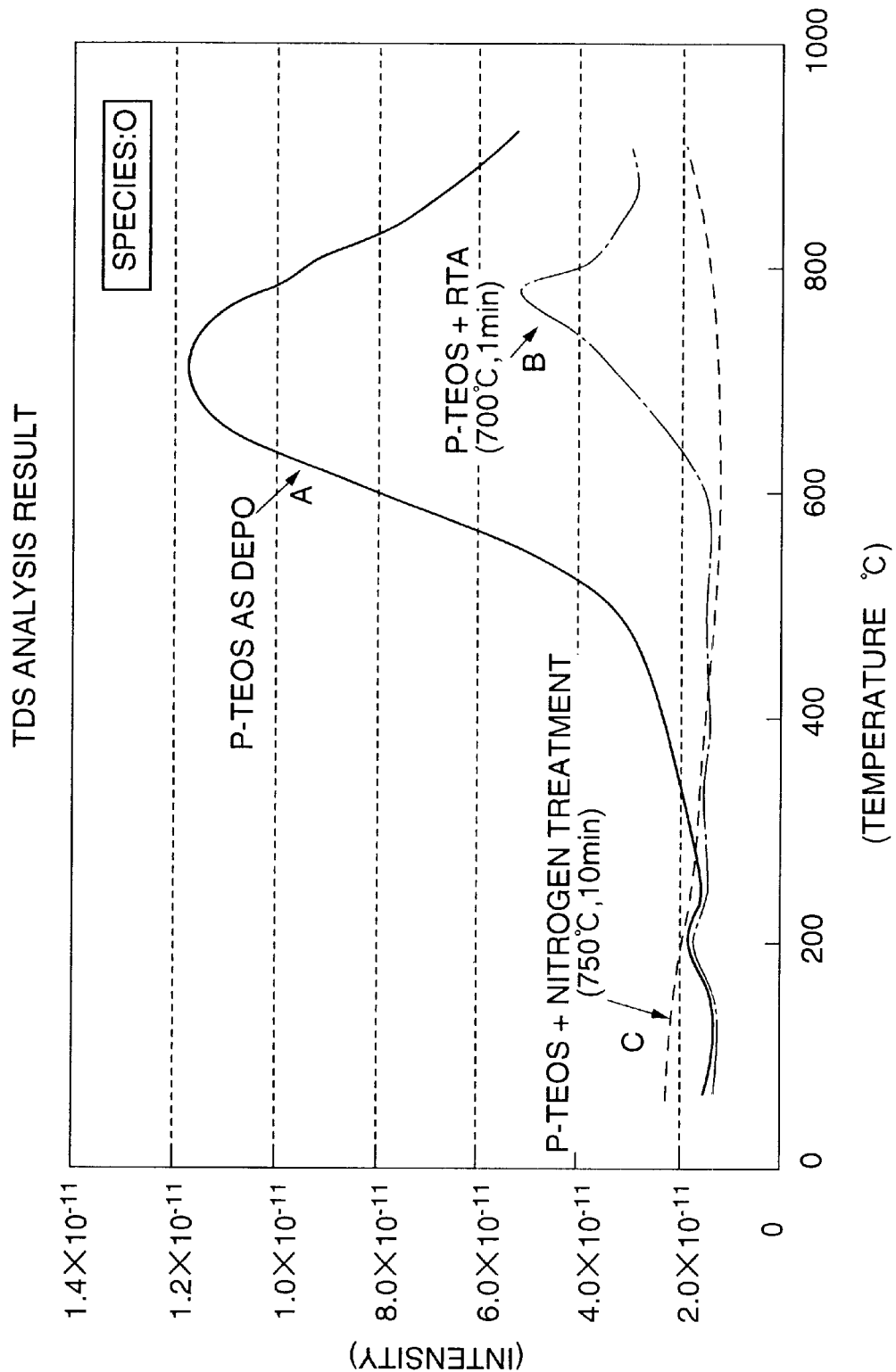
FIG. 4 is a diagram showing the result of TDS analysis relating to O in the semiconductor device manufactured by The method according to the invention.

FIG. 2 to FIG. 4 show the result of thermal desorption spectroscopy (TDS) of the semiconductor device manufactured according to the present invention, where the ordinate and abscissa show the intensity (corresponding to the quantity of desorbed gas) and the temperature, respectively. FIG. 2 to FIG. 4 show the analysis results when $H_2O$ (mass number 18), OH (mass number 17) and O (mass number 16) are selected respectively, as gas species for analysis, with gases containing oxygen as the objects of the analysis. Here, since the quantification of desorbed gas (degas) is difficult, in FIG. 2 to FIG. 4 the quantity of desorbed gas is adopted as the intensity. Higher intensity means that a lager amount of gas including oxygen is liberated in the time of the analysis from the P-TEOS oxide film which is the interlayer insulating film.

Next, as sampler for the analysis, a silicon substrate (sample A) in which a P-TEOS oxide film with thickness of about 300 nm is formed, a silicon substrate (sample B) in which after formation of a P-TEOS oxide film with thickness of about 300 nm, a rapid thermal annealing (RTA) treatment is given at 700° C. for about 1 min, and a silicon substrate (sample C) in which after formation of a P-TEOS oxide film with thickness of about 300 nm, an annealing treatment is given in a nitrogen atmosphere at 750° C. for 10 min are prepared. In other words, sample A is one formed without the use of this invention, and sample B and C are formed adopting the present invention.

As is clear from the result of analysis in FIG. 2 to FIG. 4, in sample A, desorption of gas starts in the neighborhood of 450 to 500° C., and thereafter the quantity of desorbed gas increases sharply as the temperature goes up, for all gas species of analysis. Besides, the quantity of desorbed gas decreases sharply with rise in the temperature with the neighborhood of about 700° C. as a peak. In contrast, the quantity of desorbed gas in sample B and C is very small. Although a certain degree of degassing is recognizable in the range of 750 to 800° C. for sample B and beyond about 800° C. for sample C, their amounts are markedly small composed with the amount of sample A.

From these observations, it may be said that in sample B and C, by subjecting them to an annealing treatment corresponding to the annealing treatment in the process in FIG. 1C of the first embodiment, gas including oxygen held in the P-TEOS oxide film is almost completely removed in advance.

Figures 5, 6, 7:
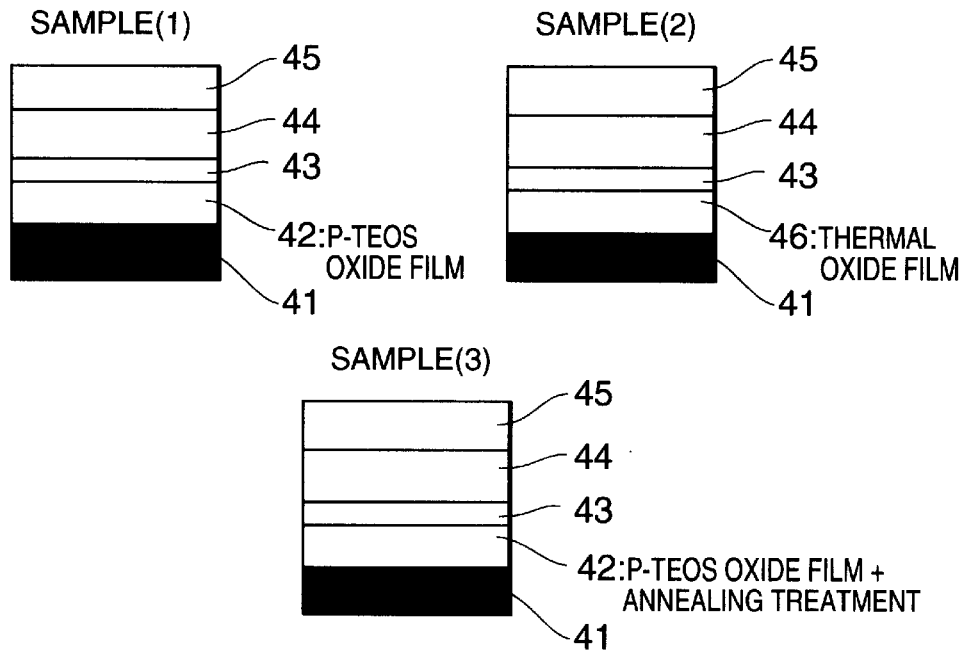
FIG. 5 is a schematic diagram showing samples (1) to (3) used for the peeling test of the semiconductor device manufacturing by the manufacturing method of semiconductor device according to the invention.
FIG. 6 is a diagram showing the evaluation result of the peeling test for the sample (1) and (2) in FIG. 5.
FIG. 7 is a diagram showing the evaluation result of the peeling test for the semiconductor device (sample (3)) manufactured by The method according to the invention.
Figure 8:
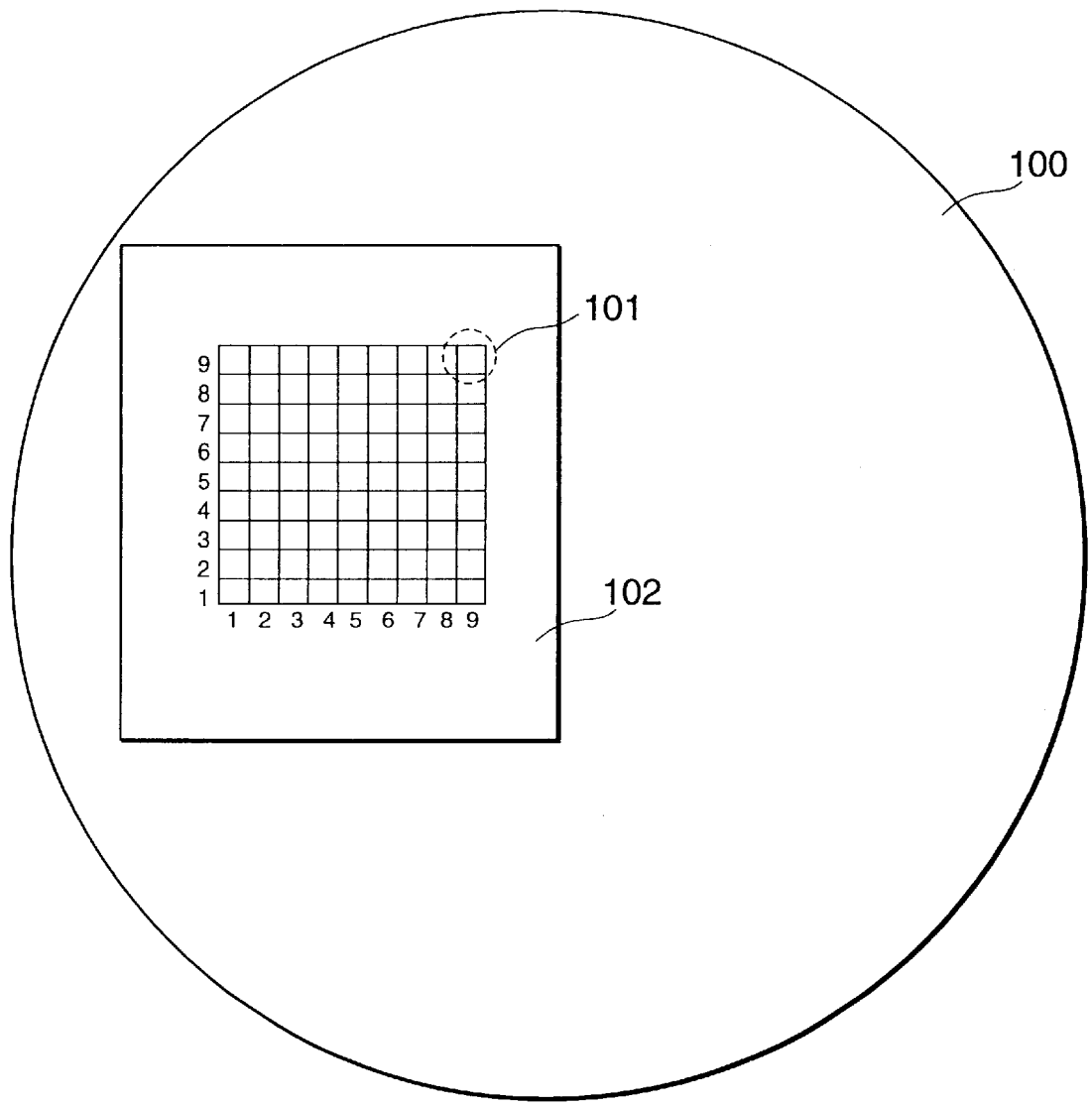
FIG. 8 is a diagram for describing the testing method of the peeling test.

FIG. 6 and FIG. 7 show the evaluation results of the peeling test (tape test) of a semiconductor device manufactured according to the present invention, and a semiconductor device manufactured without using the present invention. Here, the method of the peeling test will be described by reference to FIG. 8. First, 10×10 notches are formed in lattice form using a diamond cutter on a wafer 100 prepared in advanced as a sample, to obtain 9×9=81 small square pieces 101 with a side of 1 mm. Then, the notches are covered with a tape 102 and the tape 102 is peeled. Whether the small square pieces 101 are peeled off is confirmed using a microscope. If even one out of the plurality of the small pieces is peeled off, it is labeled NG.

The peeling test was conducted by proposing three kinds of samples (1) to (3) as shown in FIG. 5. The sample (1) has a structure in which a P-TEOS oxide film 42, a sputtered WN film 43, a sputtered W film 44 and a nitride film 45 are formed on a silicon substrate 41. The sample (2) has a structure in which a thermal oxide film 46, a sputtered WN film 43, a sputtered W film 44 and a nitride film 45 are formed on a silicon substrate 41. The sample (3) is obtained by employing the present invention and has a structure in which a P-TEOS oxide film 42, a sputtered WN film 43, a sputtered W film 44 and a nitride film 45 (thickness of 200 nm) are formed on a silicon substrate 41 and it is subjected to an annealing treatment in a nitrogen atmosphere after the formation of the P-TEOS oxide film 42.

First, the result of the peeling test for the sample (1) and (2) is shown in FIG. 6. As for the sample (1); sample (1)-1 to (1)-4 with the thicknesses 50, 100, 150, and 200 nm for the nitride film 45 are prepared, and the test was carried out on them (Nos. 1 to 4). As for sample (2), the test was carried out on a sample with a thickness of 100 nm for the nitride film 45 (No. 5). From the results of sample No. 2 to No. 4, it is found when a nitride film 45 of 100 nm or more is formed in the case of not subjecting the sample to an annealing treatment, peeling of the P-TEOS oxide film 42 (NG) occurs at both of the central part (wafer center) and the end part (wafer edge) of the substrate 41. In the meantime, in sample No. 1, no film peeling takes place (OK). This is considered due to small stress to the W film 44 because of the small thickness of 50 nm for the nitride film 45. Moreover, in sample No. 5, since the thermal oxide film 46 is an oxide film formed by oxidation of the substrate 41 itself, the film is dense composed with the P-TEOS oxide film and degassing of gas including oxygen is less, and it will be seen that film peeling (NG) does not occur even if a nitride film 45 with thickness of 100 nm or more is formed.

The result of the peeling test for the sample (3) is shown in FIG. 7. The result shows respective cases in which the annealing conditions are set at 700° C. for 1 min for sample No. 1, at 700° C. for 30 min for No. 2, at 750° C. for 10 min for No. 3 and at 750° C. for 30 min for No. 4, respectively. For the sample No. 1 to No. 4, film peeling does not occur either at the wafer center or at the wafer edge of the substrate 41. From this observation, it may be said that gas including oxygen held in the P-TEOS oxide film can be desorbed almost completely in advance by subjecting the substrate to an annealing treatment corresponding to the annealing of the process in FIG. 1C of the first embodiment, and can present the film peeling.

As in the above, according to the first embodiment of this invention, in forming the bit line 31A and the wirings 31B consisting of the W film and the WN film, respectively, after forming the interlayer insulating films 16 and 20 consisting of the CVD oxide films, gas including oxygen held in the interlayer insulating films 16 and 20 is desorbed by subjecting the substrate to an annealing treatment in a nitride atmosphere at 700 to 800° C. for 1 to 30 min, and the bit line 31A and the wirings 31B are formed after the annealing process. For this reason, even if the substrate is subjected to a heat treatment for forming the nitride film 32, the bit 31A and the wiring 31B are hardly oxidized because there is remaining little gas that includes oxygen in the interlayer insulating films 16 and 20. Accordingly, adhesion of the bit line 31A and the wirings 31B to the second interlayer insulating film 20 will not be deteriorated, and the peeling of the bit line 31A and the wirings 31B from the second interlayer insulating film 20 can be prevented.

Here, in the first embodiment, since the nitride film 32 is formed at a temperature of about 700° C., the annealing treatment at 700° C. in FIG. 1C is sufficient for degassing.

However, when the nitride film 32 is formed at a temperature of about 750° C., for example, the annealing treatment for degassing need to be performed at a temperature of more than 750° C. The upper limit of the temperature of the annealing treatment that is in the process in FIG. 1C is preferable to be set at about 800° C. which will not cause re-diffusion of each of the N type diffusion regions 7, 8 and 11, 12 as mentioned above. Further, it is not preferable that a time of the annealing treatment for degassing is too long, because it is possible that re-diffusion of the diffusion regions 7, 8, 11 and 12 even if the temperature of the annealing treatment is less than 800° C. Therefore, it is preferable that the time of the annealing treatment is less than 30 min. In addition, when, after the formation of the nitride film 32 to be used as a mask for bit line patterning in the process in FIG. 1L, the substrate is subjected to a heat treatment at a temperature exceeding its film formation temperature (about 700° C. in the above example), it is necessary to carry out an annealing for degassing in advance by setting the temperature at a value higher than the heat treatment temperature.

The annealing treatment for degassing need not be performed in the process in FIG. 1C, and may be done at any time after the formation of the second interlayer insulating film 20 and before the formation of the W film 28, and a sufficient effect can be obtained even when it is performed around the formation of the contact holes 22, 24 and 25 in the processes in FIG. 1D and FIG. 1E.

In the present embodiment, a plug layer 18 consisting of amorphous silicon is formed on the diffusion region of the memory cell transistor 5, and plug layers 28A consisting of tungsten is formed on the diffusion regions of the peripheral circuit element 6. However, materials of the plug layers are not limited to the mentioned above, both of the plug layers 18 ad 28A may be formed of tungsten, for example.

Second Embodiment

In a second embodiment, when amorphous silicon is used for the plug layer in the memory cell region as in the first embodiment, an example of introducing an ion implantation process to the plug layer for the purpose of reducing its resistance will be shown. In the following, referring to FIGS. 9A and 9B, the manufacturing method of the semiconductor device will be described in the order of the processes.

Figure 9A:
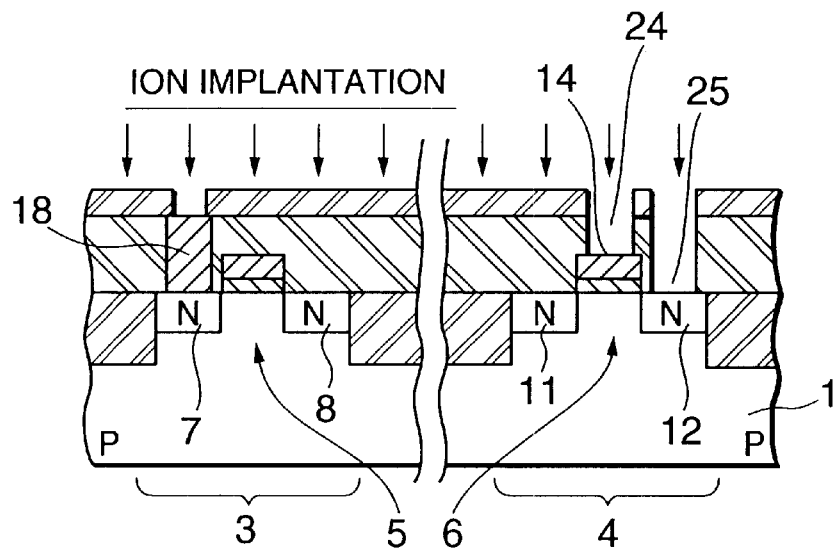
FIGS. 9A and 9B are process diagrams showing in the order of the processes The method according to the invention.

Here, almost the same processes as those in FIG. 1A to FIG. 1E in the first embodiment are repeated. However, in this example, in the process in FIG. 1C, the annealing treatment for desorbing gas including oxygen confined in the first and second interlayer insulating films 16 and 20 will be excluded. Next, after removed of the resist film 23, an ion implantation is performed on the entire surface using phosphorus (P) or boron (B) as impurities, as shown in FIG. 9A. In this case, ion implantation of the impurities need be performed at least to the plug layer on the memory cell region 3.

Figure 9B:
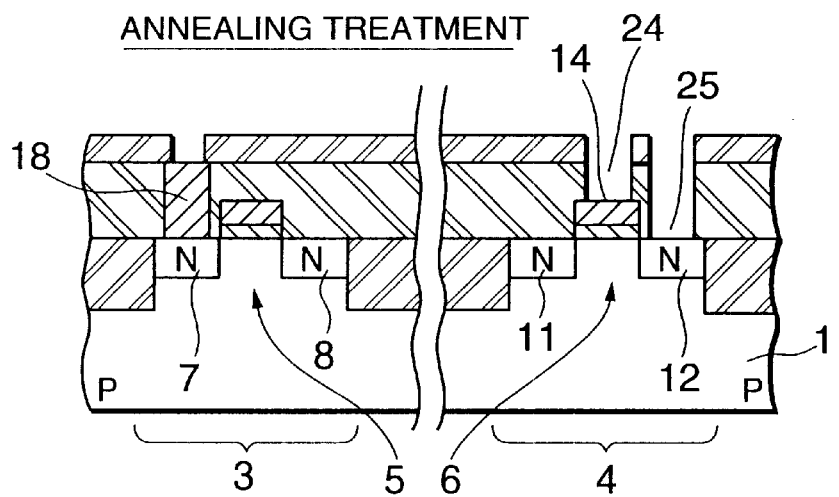
Figure 10A:
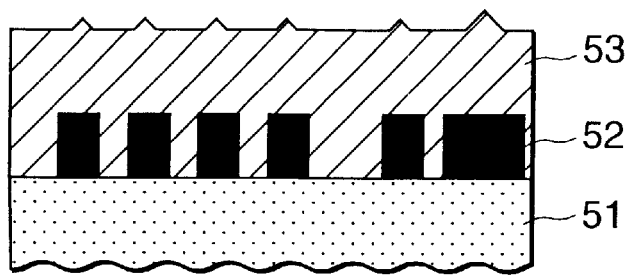
FIGS. 10A to 10D are process diagrams showing in the order of the processes The method according to the conventional method.
Figure 10B:
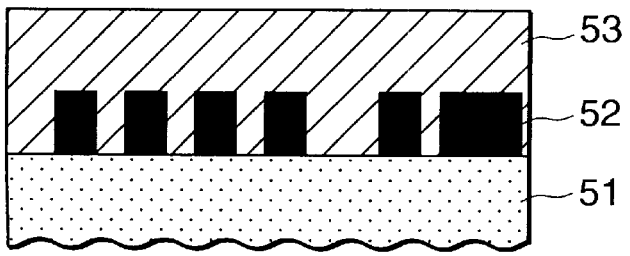
Figure 10C:
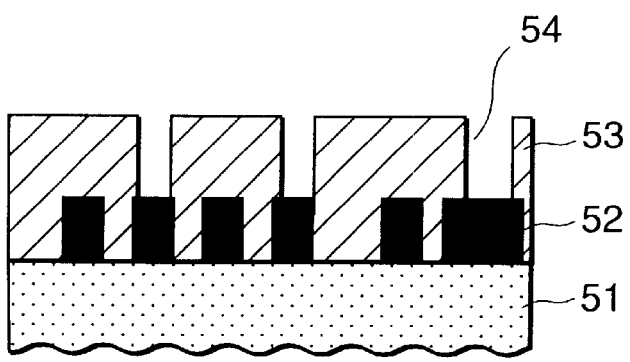
Figure 10D:
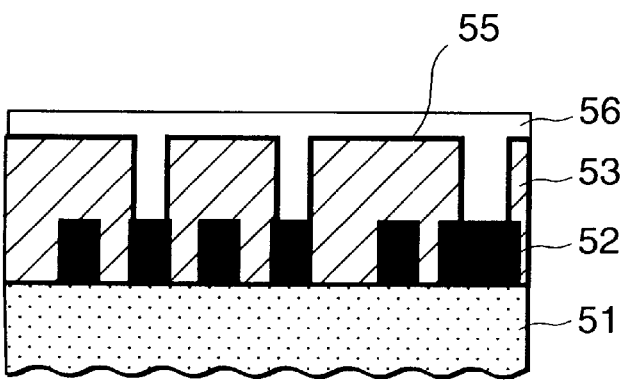

Next, as shown in FIG. 9B, the substrate 1 is subjected to an annealing in a nitrogen atmosphere at a temperature in the range of 700 to 750° C. for 1 to 30 min. By this annealing treatment, activation of the ion implanted the impurities is performed, and the gas including oxygen held in the interlayer insulating films 16 and 20 is desorbed. In other words, the annealing treatment in this process is designed to execute activation of the impurities after the ion implantation and degassing of gas including oxygen confined in the interlayer insulating films 16 and 20 in one heat treatment.

After this process, processes almost the same as those in FIG. 1F and thereafter of the first embodiment are repeated to complete a DRAM.

As in the above, according to this embodiment, when impurity ions are implanted for reduction of the resistance of the plug layer 18 formed in the memory cell region 3, activation of the impurities as well as degassing of gas including oxygen in the interlayer insulating films 16 and 20 are carried out, so that two kinds of annealing treatments can be executed in a simple heat treatment, reducing the number processes.

Thus, according to the constitution of the second embodiment it is possible to attain almost the same effect as described in connection with the first embodiment, and the two kinds of annealing treatments can be performed by one time of heat treatment process, achieving reduction in the number of processes.

The annealing treatment for degassing is not limited to be given in the process shown in FIG. 9B, and may be given at any time after the formation of the second interlayer insulating film 20 and before the formation of the W film 28, for example, may be given in the process shown in FIG. 1C the same as in the first embodiment. Moreover, the annealing treatment for activation of the ions of the implanted impurities need not be given at immediately after the ion implantation and may be given for example, after the formation of the bit line 31A in the process shown in FIG. 1L. However, since the execution of both annealing treatments in separate processes results in the increase in the number of processes, it is preferable that it is carried out immediately after the ion implantation.

In the above, referring to the drawings, the embodiments of this invention have been described in detail. However, it is apparent that the present invention is not limited to the above embodiment, but may be modified and changed without departing from the scope and sprit of the invention. Thus, for example, in forming the bit line composed of a W film on the second interlayer insulating film, an example using a WN film as the adhesion layer has been described, but the adhesion layer is not limited to the WN film and another conductive material such as a titanium nitride (TiN) film, a titanium film (Ti), Ti/TiN film or the like may be employed. Moreover, the W film may be formed directly on the second interlayer insulating film without using the W film as an adhesion layer. Furthermore, as an objective semiconductor device of this invention a DRAM is adopted, but it is not limited to this case alone and the invention is applicable to other type of semiconductor device as long it is a device which requires formation of wirings including metal material of a W film, a WN film, a TiN film a Ti film or the like.

In the two embodiments in the above, example are shown in which a nitride film which plays the role of a mask film is formed on the wiring metal film, so that an annealing treatment at a temperature of about 700° C. or more which is the film formation temperature of the nitride film is arranged to be given in advance. However, when there is not involved a formation process of a nitride film, the lower limit of the temperature of the annealing for degassing need not be limited to this value. By subjecting the wafer to an annealing treatment in advance prior to the formation of a metal film, at a temperature higher than the temperature adopted in some heat treatment process to be given after the formation of the metal film, it becomes possible in the heat treatment process to prevent degassing of gas including oxygen from the interlayer insulating film. Therefore, the problem of peeling of the metal film from the interlayer insulating film can be prevented. Accordingly, it is desirable to subject the wafer to an annealing treatment prior to the formation of the metal film, at a temperature higher than the temperature of the process in which heat at the highest temperature is applied to the wafer, among a plurality of processes after the formation of the metal film.

The method of forming a P-TEOS oxide film by plasma CVD as the interlayer insulating film has been described as an example in the above embodiments. However, even when some other film is used as the interlayer insulating film, similar problem can occur with varying degree of acuteness. Accordingly, the interlayer insulating film is not limited to the P-TEOS oxide film, and some other CVD silicon oxide film such as LP (Low pressure)—TEOS oxide film (film formation temperature of about 700° C.) AP (atmospheric pressure)—CVD oxide film (film formation temperature of about 400° C.) may be employed.

Moreover, for the gate insulating film of the transistors forming a DRAM, a nitride film or a double film configuration of an oxide film and a nitride film may be employed. In other words, so long as it is a metal insulator semiconductor (MIS) transistor, it is not limited to a MOS transistor, and may be a metal nitride semiconductor (MNS) transistor or a metal nitride oxide semiconductor (MNOS) transistor. Furthermore, in each semiconductor region, the P type and the N type may be inverted.

As has been described in the above, according to The method, in forming wirings composed of a film of a metal such as W on a interlayer insulating film, gas including oxygen held in the interlayer insulating film is arranged to be removed after the formation of the interlayer insulating film and before the formation of the wirings. With this arrangement, it is possible to present the peeling of the metal film caused by gas including oxygen confined in the interlayer insulating film even when the wafer is subjected to a heat treatment after the formation of the metal film.

What is claimed is:

1. A method of manufacturing a semiconductor device, comprising:
    forming an insulating film over a semiconductor substrate, oxygen being introduced into said insulating film during formation of said insulating film;
    removing said oxygen from said insulating film by an annealing treatment to provide an oxygen-removed insulating film;
    forming a metal film on said oxygen-removed insulating film; and
    performing a heat treatment after formation of said metal film,
    wherein said annealing treatment is performed at a temperature which is not lower than said heat treatment, and said heat treatment includes forming a silicon nitride film over said metal film at a temperature in the range of 700 to 800° C.

2. The method as claimed in claim 1, wherein said annealing treatment is performed at a temperature in the range of 700 to 750° C.

3. The method as claimed in claim 1, further comprising patterning said silicon nitride film and forming desired wiring by patterning said metal film with said patterned nitride film as a mask.

4. The method as claimed in claim 1, wherein said insulating film is a CVD silicon oxide film.

5. The method as claimed in claim 1, wherein said metal film comprises at least one of a W film, a WN film, a TiN film and a Ti film.

6. A method of manufacturing a semiconductor device comprising:
    providing a memory cell region and a peripheral circuit region and forming a first transistor as a memory cell transistor in said memory cell region and a second transistor as a peripheral circuit element in said peripheral circuit region, respectively;

forming a first insulating film that covers said first and second transistor;

forming a first contact hole reaching an impurity diffusion region of said first transistor in said first insulating film;

filling said first contact hole with a first plug layer which comprises a silicon film;

forming a second insulating film that covers said first insulating film and said first plug layer;

ion implanting desired impurities to said first plug layer for the purpose of reducing the resistance of the first plug layer;

performing an annealing treatment to activate said impurities and remove oxygen held in said first and second insulating films at the same time;

forming a second contact hole reaching said first plug of said second insulating film;

forming a third contact hole reaching an impurity diffusion region of said second transistor in said second and first insulating film;

filling said second contact hole with a second plug layer as well as filling a third contact hole with a third plug layer;

forming a metal film on said second insulating film and said second and third plug layers; and forming a bit line connected to said second plug layer and a wiring connected to said third plug layer by patterning said metal film.

7. The method as claimed in claim 6, further comprising forming a silicon nitride film on said metal film;

forming a mask layer by patterning said silicon nitride film; and patterning said metal film into said bit line and said wiring by using said patterned silicon nitride film as a mask.

8. The method as claimed in claim 7, wherein a temperature of said annealing treatment is not lower than a temperature for the formation of said silicon nitride film.

9. The method as claimed in claim 6, wherein said metal film comprises at least one of a W film, a WN film, a TiN film and a Ti film.

10. A method of manufacturing a semiconductor device, comprising:

forming a first insulating film over a semiconductor substrate;

forming a metal film on said first insulating film; and forming a second insulating film on said metal film at a first temperature, wherein annealing treatment is performed on said first insulating film before said metal film is formed, said annealing treatment being carried out at a second temperature which is not lower than said first temperature, and wherein said second insulating film is used as a mask for selectively etching said metal film to form a wiring layer.

11. The method as claimed in claim 10, wherein said method further comprises selectively etching said second insulating film to form a mask pattern and selectively etching said method film by use of said mask pattern to form a wiring layer, said first insulating film being a CVD silicon oxide film and said second insulating film being a silicon nitride film.

12. The method as claimed in claim 10, wherein said metal film comprises at least one of a W film, a WN film, a TiN film and a Ti film.

13. The method as claimed in claim 11, wherein said silicon nitride film is formed at a temperature in the range of 700 to 800° C.

14. The method as claimed in claim 13, wherein said annealing treatment is performed at a temperature in the range of 700 to 750° C.

15. The method as claimed in claim 13, wherein said annealing treatment is performed for 1 to 30 minutes.

* * * * *